United States Patent [19]

Moslehi

[11] Patent Number: 5,192,849
[45] Date of Patent: Mar. 9, 1993

[54] MULTIPURPOSE LOW-THERMAL-MASS CHUCK FOR SEMICONDUCTOR PROCESSING EQUIPMENT

[75] Inventor: Mehrdad M. Moslehi, Dallas, Tex.

[73] Assignee: Texas Instruments Incorporated, Dallas, Tex.

[21] Appl. No.: 565,765

[22] Filed: Aug. 10, 1990

[51] Int. Cl.$^5$ .............................................. B23K 9/00
[52] U.S. Cl. ........................... 219/121.43; 219/121.49; 219/121.4; 219/158; 156/345
[58] Field of Search ........ 219/121.43, 121.4, 159-161, 219/121.49; 156/345, 643, 646; 427/34; 313/111.21, 111.31, 111.51

[56] References Cited

U.S. PATENT DOCUMENTS

| | | | |
|---|---|---|---|
| 4,361,749 | 11/1982 | Lord | 219/121.43 |
| 4,430,547 | 2/1984 | Yoneda et al. | 219/121.43 |
| 4,565,601 | 1/1986 | Kakehi et al. | 156/643 |
| 4,631,106 | 12/1986 | Nakazato et al. | 156/345 |
| 4,886,571 | 12/1989 | Suzuki et al. | 156/646 |
| 4,971,653 | 11/1990 | Powell et al. | 156/345 |

*Primary Examiner*—Mark H. Paschall
*Attorney, Agent, or Firm*—Stanton C. Braden; Richard L. Donaldson; William E. Hiller

[57] ABSTRACT

A multipurpose low-thermal-mass radio-frequency chuck for semiconductor device processing equipment (18) and applicable to plasma processing over a wide range of substrate temperatures. The stacked multilayer chuck structure comprises process vacuum base plate (16), heating module (48), cooling module (44) and radio-frequency power plate (50). Vacuum base plate (16) provides mechanical support and necessary feedthroughs (RF power connection, coolant inlet/outlet, heater wires and thermocouple) for main chuck (20). Water-cooled vacuum base plate (16) is thermally insulated from main chuck module (20). Heating element (48) comprises top layer (80) of electrical insulation and passivation, power heating resister (82), bottom layer of electrical insulation (84) and heater substrate (86) made of boron nitride or quartz or SiC-coated graphite. Coolant module (44) comprises a plurality of coolant tunnels and is made of a high thermal conductivity material (nickel-plated copper, aluminum or a suitable refractory metal). Radio-frequency plate (50) comprises a refractory metal or aluminum material.

25 Claims, 11 Drawing Sheets

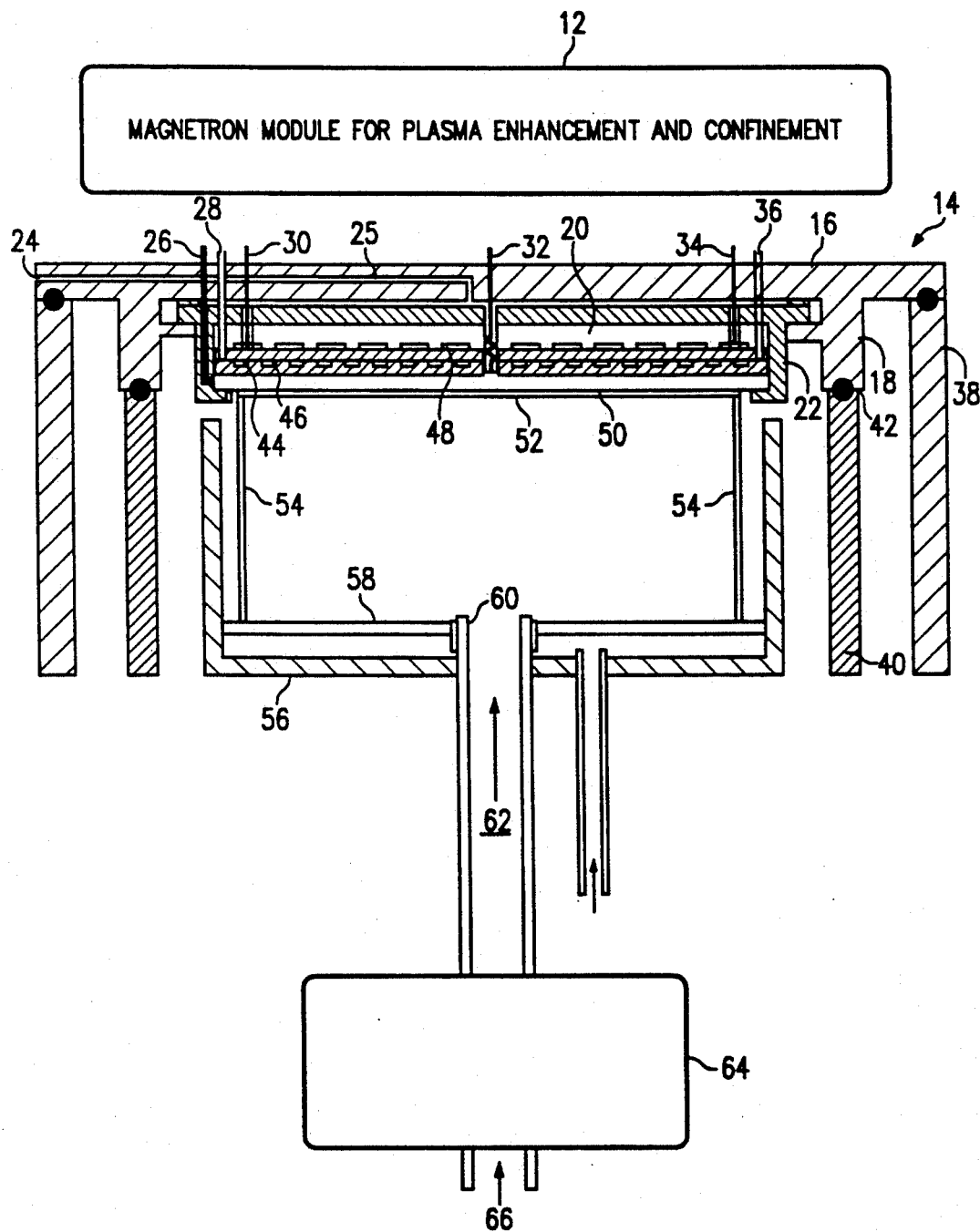

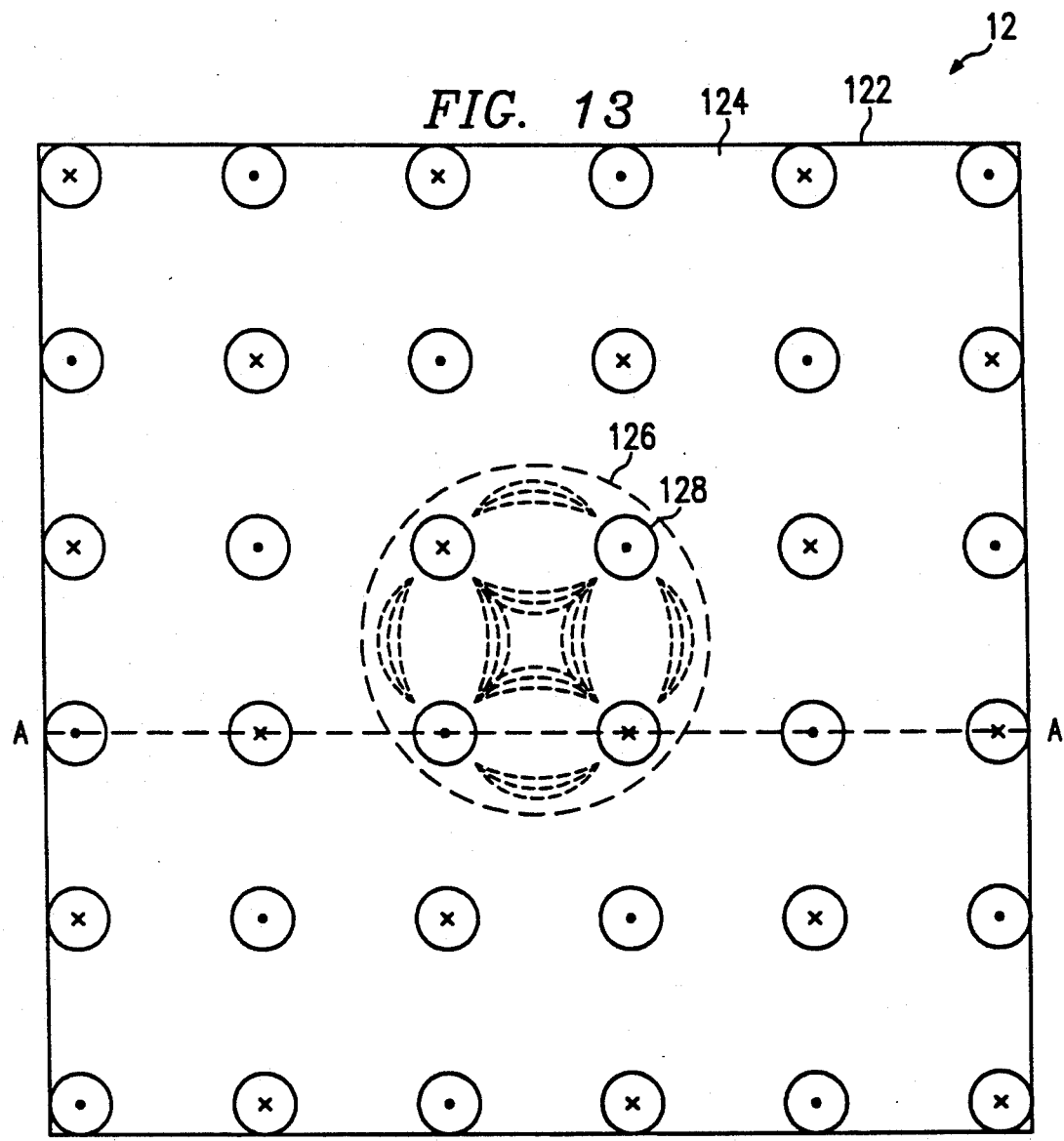
FIG. 13
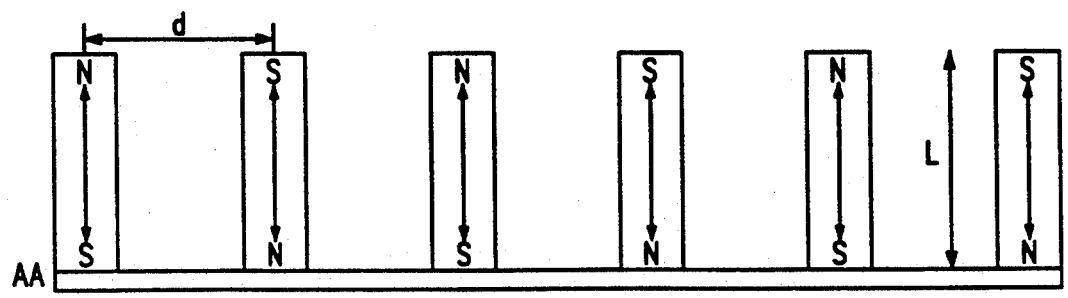

FIG. 14
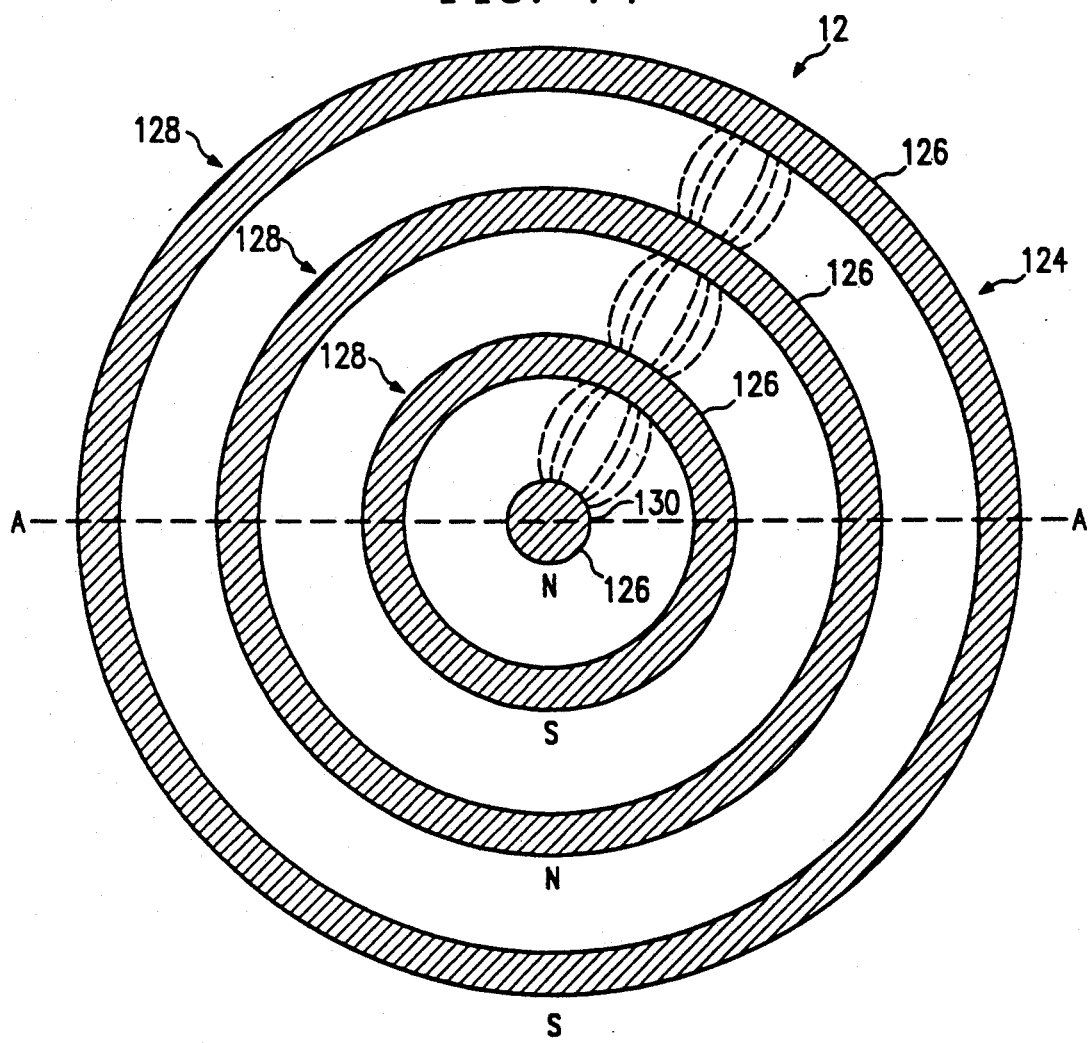
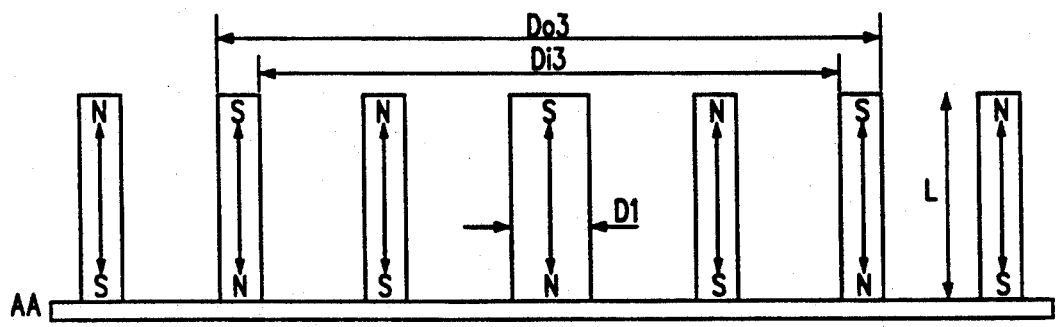

FIG. 15
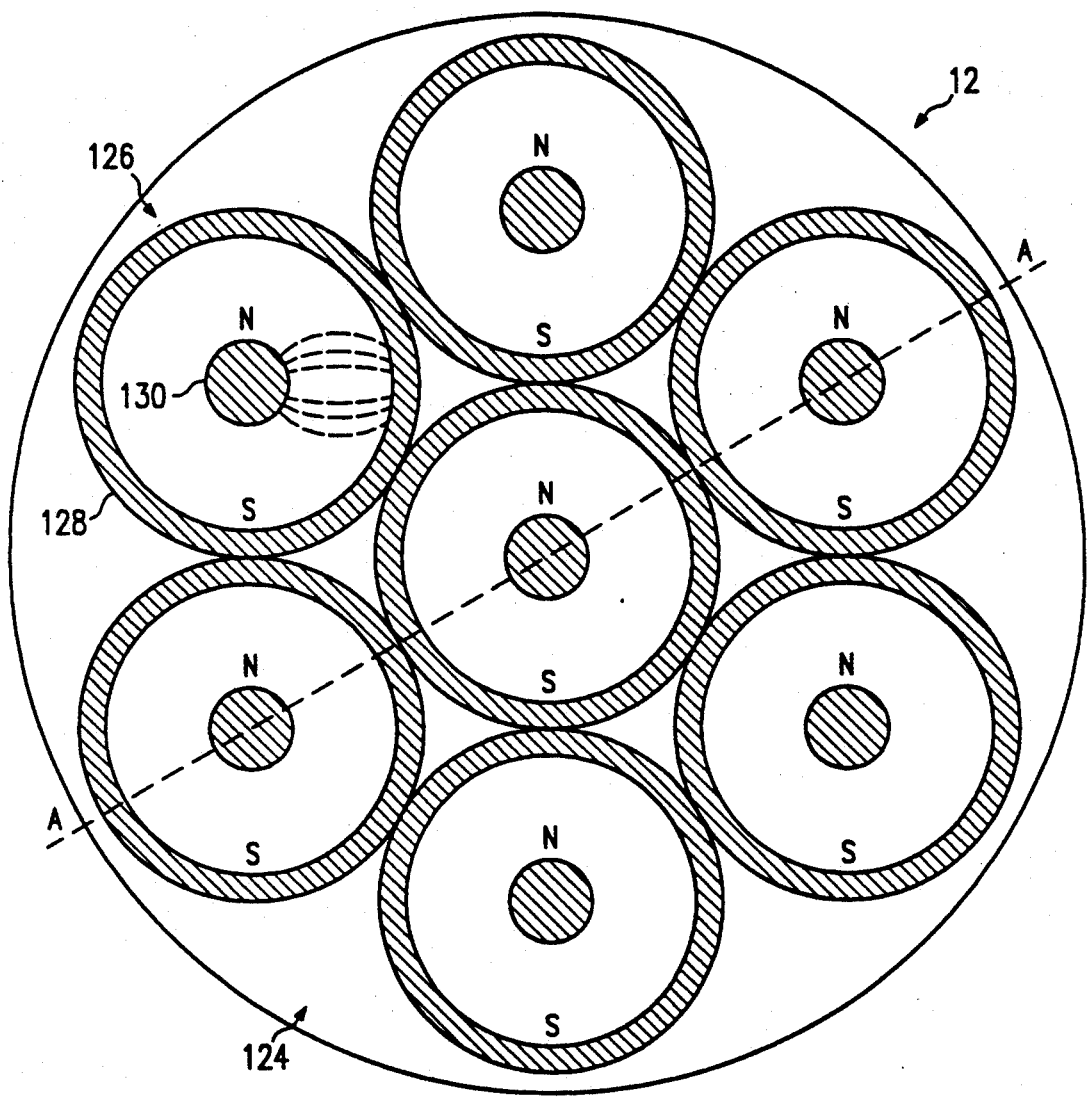
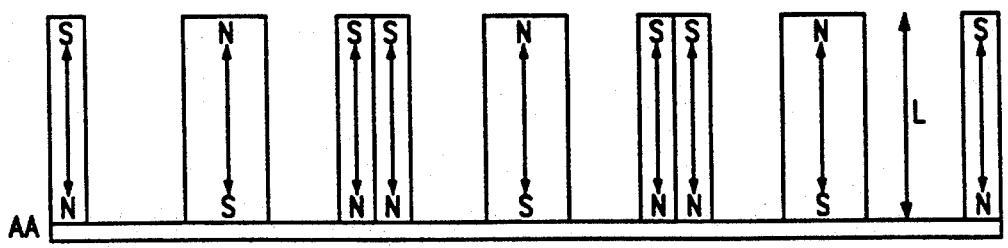

MULTIPURPOSE LOW-THERMAL-MASS CHUCK FOR SEMICONDUCTOR PROCESSING EQUIPMENT

TECHNICAL FIELD OF THE INVENTION

The present invention relates in general to a multipurpose low-thermal-mass chuck for semiconductor processing equipment, and more particularly to a method and apparatus for producing radio-frequency plasma, wafer heating, and wafer cooling in plasma processing applications (etch, deposition, annealing, and surface cleaning).

BACKGROUND OF THE INVENTION

Manufacturers of electronic components use a variety of techniques to fabricate semiconductor devices. One technique that has many applications is known as "plasma-assisted" processing. In plasma-assisted processing, a substantially ionized gas, usually produced by a radio-frequency electromagnetic gas discharge, provides activated neutral and ionic species that chemically react to deposit or to etch material layers on semiconductor wafers in a fabrication reactor. Reactive-ion etching (RIE), an example of plasma-assisted processes, uses the directional and energetic ions in a plasma to anisotropically etch a material layer. RIE can take place in a conventional parallel-electrode plasma processing equipment or similar semiconductor device fabrication reactor.

Applications of plasma-assisted processing for semiconductor device manufacturing include RIE processing of polysilicon, aluminum, oxides, and polyimides; plasma-enhanced chemical-vapor deposition (PECVD) of dielectrics, aluminum, and other materials; low-temperature metal-organic chemical-vapor deposition (MOCVD) of metals including aluminum and copper; low-temperature dielectric chemical-vapor deposition for planarized interlevel dielectric formation; and low-temperature growth of epitaxial semiconductor layers.

In RIE, a high-energy radio-frequency (RF) power source is applied across two parallel electrodes to produce a plasma via electrical gas discharge. Conventional plasma processes such as RIE, impose a trade-off between processing rate and semiconductor device quality. To increase the RIE processing rate requires greater plasma density and/or ion flux. The plasma density and ion flux can be increased by raising the electrical RF power absorbed within the plasma medium. Increasing the RF power to the plasma medium, however, raises the plasma ion energy levels. Ions with excessive energies may damage semiconductor devices. This is because the ions can be so energetic (hundreds of electron volts) that upon impact they penetrate and cause irradiation damage to the semiconductor device surface. When this type of ion radiation damage occurs, a post-etch surface cleaning and/or annealing process is necessary to minimize the adverse effects to the semiconductor device performance. Some RIE processes may also leave undesirable chemical deposits such as fluorohydrocarbons on the semiconductor device surface. Ultimately, the manufacturer must remove these deposits from the semiconductor device in order to prevent degradation of device fabrication yield. Due to lack of plasma confinement, the conventional plasma processing techniques may introduce various contaminants (e.g., metals into the semiconductor substrate. The contaminants can be transferred by the plasma medium via its interactions with the process chamber walls and the plasma electrodes.

The combined effects of plasma-induced surface damage and contamination produce semiconductor devices with less than optimal performance characteristics and limit fabrication process yield. Thus, with conventional plasma-assisted processing techniques, increasing RF power to increase plasma density with the intent to raise the process rate can have serious detrimental effects. If a method existed, however, to increase the plasma density and ion flux without also significantly increasing ion energies, then a manufacturer may increase plasma-assisted processing rates.

Therefore, a need exists for a method and apparatus to increase plasma density near a semiconductor wafer during plasma-assisted processing without at the same time increasing ion energy levels.

As indicated before, another limitation of conventional plasma-assisted processes derives from the fact that, during these processes, plasma disperses throughout the fabrication process chamber. In so doing, it interacts with the process chamber walls. These walls contain various metals that the activated plasma species can remove, transport to a semiconductor substrate surface, and embed into the semiconductor devices. As a result, further semiconductor device performance and reliability degradation occurs.

Consequently, there is a need for a method and apparatus to prevent plasma interaction with fabrication reactor process chamber walls during plasma-assisted processing.

To remedy the above problems, manufacturers often use a special type of plasma-assisted processing known as "magnetron-plasma-enhanced" (MPE) processing. MPE processing basically entails crossing a magnetic field with an electric field in the proximity of a semiconductor substrate during plasma processing. The crossed magnetic and electric fields cause the plasma to appear as a gaseous ball enveloping the semiconductor wafer and centered therewith. As a result, the plasma ion density is greatest around the semiconductor wafer. The plasma that the semiconductor substrate sees, therefore, does not interact significantly with the process chamber walls. MPE processing also provides improved gas excitation and higher plasma density than with the conventional plasma-assisted processes. MPE processing raises the device processing rate and reduces semiconductor device degradation from plasma-induced contaminants by making the plasma medium concentrate near the semiconductor substrate. Thus, MPE processing can produce higher semiconductor device processing rates without having to increase the local plasma ion energies.

The electric field for the magnetron-plasma-enhancement can be the result of either an externally applied DC bias or, alternatively, a self-induced plasma DC bias produced on a radio frequency (RF) power source coupled to the wafer stage and the plasma medium. Coupling an RF power source to the wafer stage results in the formation of an electric field perpendicular to the wafer surface across the plasma sheath and produces the $\vec{E} \times \vec{B}$ magnetron effect (in the presence of a transverse magnetic field). Conventional chucks for RF plasma processing, however, suffer from numerous limitations.

Conventional RF chucks used for plasma processing in a semiconductor device fabrication chamber use an RF electrode to generate the plasma. These devices usually have a large thermal mass and do not possess capability to operate over a wide range of temperatures. As a result, they have associated long thermal heat-up and cool-down transient times and cause substrate temperature nonuniformities during heating and cooling. During MPE processing, temperatures within a fabrication reactor can range from −150° C. to +750° C. (The conventional RF plasma chucks can usually operate either in the lower temperature range (e.g., 0° C. to 200° C. for plasma etch processes) or in the medium temperature range (for temperatures up to 450° C. for plasma deposition processes). The conventional RF plasma chuck devices are not multipurpose and are usually incompatible with external magnetron sources. Advanced anisotropic etch processes can greatly benefit from very low or cryogenic substrate temperatures (as low as −150° C.) due to elimination of lateral etch (no etch undercut) and enhanced etch selectivity. Moreover, magnetron-plasma enhancement (with or without a cryogenic substrate temperature) provides additional process improvements. Magnetron-plasma-enhanced (MPE) cryogenic processing may also have important applications for deposition of thin films. MPE processing at higher temperatures (100° C. up to 750° C.) has important applications for thin-film (e.g. metal) deposition and plasma annealing. Capabilities for rapid wafer temperature cycling and uniform wafer heating and cooling over a wide range of temperatures (−150° C. to 750° C.) are essential for device fabrication throughput and yield. Conventional chucks do not provide all these capabilities together. As a result, there is a need for multipurpose RF chuck having a low thermal mass for rapid semiconductor wafer heating and cooling times. There is also a need for an MPE processing RF chuck that provides uniform wafer heating and cooling during both transient and steady-state conditions, and strong magnetic field at the substrate surface using an external magnetron source.

Other limitations associated with the conventional RF chucks for MPE processing include limited operating temperature ranges and limited magnetic field transmittance values. As temperatures exceed 500° C., known RF chucks overheat and suffer from component and performance degradation. Conventional RF chucks also fail at very low or cryogenic temperatures. Thus, there is a need for an MPE processing RF source that possesses extended temperature ranges of −150° C. up to 750° C. with negligible component or performance degradation.

Known RF chucks also suffer from a large component thickness (e.g., over two inches) that necessarily places the semiconductor substrate a distance from an external magnetron module. A thinner RF chuck would permit placing a semiconductor wafer closer to the magnetron, thus allowing either a smaller and less expensive magnetron or a greater magnetic field strength and process uniformity for an optimal MPE effect. A need exists for an RF chuck having a smaller thickness than that of conventional devices in order to minimize the distance between a semiconductor substrate and an MPE module and, as a result, enhance the MPE process uniformity and throughput.

SUMMARY OF THE INVENTION

According to one aspect of the present invention, there is provided a multipurpose low-thermal-mass radio-frequency chuck for semiconductor processing equipment for applications such as chemical-vapor deposition (CVD) and RF plasma processing of a semiconductor wafer. The stacked chuck structure comprises a coolant module for extracting heat from the semiconductor device, a heating element adjoining the coolant module for heating the semiconductor device. A radio-frequency plate for associating an electromagnetic radio-frequency power source with the semiconductor wafer, and a vacuum base plate for mechanical support and providing vacuum seal to a process chamber.

Another aspect of the present invention includes a plasma processing radio-frequency chuck for magnetron-plasma-enhanced processing of a semiconductor wafer. The radio-frequency chuck comprises a coolant module (stacked or sandwiched between two electrically insulating and thermally conducting boron nitride disks) for extracting heat from the semiconductor wafer, a heating element adjacent to the coolant module for heating the clamped semiconductor substrate, a radio-frequency plate for associating an electromagnetic radio-frequency power source with the semiconductor wafer, and a vacuum base plate for mechanical support and providing vacuum seal to an MPE processing chamber. The coolant module includes a plurality of coolant tunnels for permitting a liquid or gas coolant to flow and cool the semiconductor wafer. The heating element has a top layer of electrical insulation and passivation. Beneath the top layer a power resistor made of a thin refractory metal film generates thermal energy to heat the semiconductor substrate. A bottom layer of electrical insulation and adhesion film adjoins the top layer and power resistor and seals the power heating resistor therebetween. Additionally, a metallic or graphite wafer adjoins the coolant module (with a boron nitride buffer wafer placed in between) and structurally supports the stacked chuck elements. The radio-frequency plate can be made of a silicon-carbide-coated graphite wafer or various metals for coupling a radio-frequency electromagnetic power to the semiconductor wafer surface. The radio-frequency chuck of the present invention has a thickness of less than 1.25" (total thickness including the vacuum base plate).

The RF chuck of the present invention is low thermal mass and multipurpose because it not only allows RF biasing of the substrate, but it also heats and cools the semiconductor wafer with rapid thermal transients over a wide range of temperatures. Because it can perform these three functions, the RF chuck of the present invention greatly enhances the performance and application domain of the semiconductor device processing chamber. This can also increase MPE processing uniformity and throughput and semiconductor device fabrication yield.

A technical advantage of the RF chuck of the present invention is that it has a low thermal mass for rapid semiconductor wafer heating and cooling. The low thermal mass of the RF chuck and the configuration of the coolant block and power resistor plate ensures that the chuck uniformly heats and cools the semiconductor device both during transient and steady-state conditions within the fabrication reactor.

Another technical advantage of the RF chuck of the present invention is that it possesses an extended temperature range of operation relative to known RF chucks. The RF chuck can operate at temperatures in the range of −150° C. to 750° C. with negligible component or performance degradation.

Yet another technical advantage of the present invention is that it is based on a stacked multilayer design and is a thinner device than known RF chuck for plasma and MPE processing. This results in a minimal spacing between a semiconductor substrate within the plasma process chamber and an external magnetron module. This feature results in an increase in overall MPE processing rate and improved process uniformity.

Another technical advantage of the present invention is that it is easily scalable for semiconductor wafer sizes larger than the conventional 150 mm wafers (e.g. 200 mm and larger). Also, the RF chuck of the present invention is compatible with single-wafer plasma processing reactors and various magnetron plasma modules thereby making it more useful and functional than many known RF chucks that can only be used with a limited number of processing equipment configurations. A manufacturer can expect the RF chuck of the present invention to have a long lifetime, be reliable, and be applicable to a wide range of plasma processing equipment configurations.

Still another technical advantage is that the present invention has a wide variety of applications. Plasma-assisted processes that the present invention can improve include high-rate reactive-ion etching (RIE) of polysilicon, aluminum, oxides, and polyimides; plasma-enhanced chemical-vapor deposition (PECVD) of dielectrics, aluminum, and other materials; low-temperature metal-organic chemical-vapor deposition (MOCVD) of metals including aluminum and copper; low-temperature dielectric chemical-vapor deposition for planarized interlevel dielectric formation and low-temperature epitaxial growth of semiconductors. Additional applications include magnetron-plasma processing (e.g., dry development of photoresist layers) and cryogenic magnetron plasma processing (for etch and deposition processes). Other applications will become apparent as manufacturers use the present invention.

BRIEF DESCRIPTION OF THE DRAWINGS

The invention, as well as modes of use and further advantages, is best understood by reference to the following description of illustrative embodiments when read in conjunction with the accompanying drawings.

FIG. 1 shows a partially broken-away diagrammatic view of the plasma processing system and the multipurpose chuck integrated with the magnetron plasma module that can be used with the present invention;

FIG. 13 is an alternative embodiment of the magnetron module of the present invention using a distributed square magnetic array;

FIG. 14 shows an alternative embodiment of the magnetron module of the present invention using a cylindrical concentric-ring magnetic array; and FIG. 15 is an alternative embodiment of the magnetron module of the present invention using distributed cylindrical magnetic array with a combination of ring-shaped and cylindrical magnets.

DETAILED DESCRIPTION OF THE INVENTION

Figure 3:
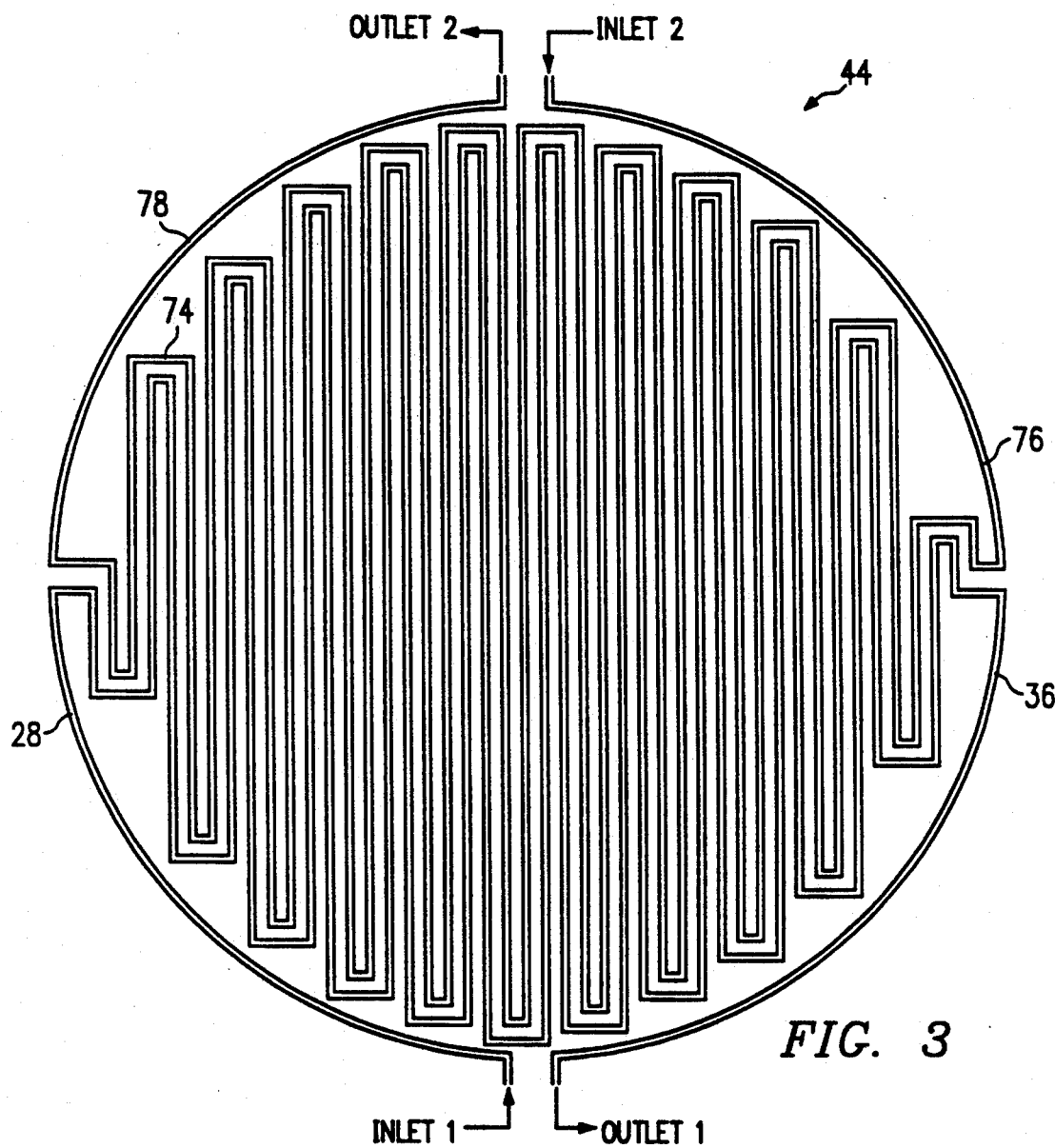
FIG. 3 provides a planar view of a preferred embodiment of the groove pattern in the multipurpose chuck coolant module.

The preferred embodiment of the present invention is best understood by referring to FIGS. 1–15, like numerals being used for like and corresponding parts of the various drawings.

FIG. 1 shows a partially broken away diagrammatic view of low-thermal-mass multipurpose chuck 20 and more particularly illustrates its connections and implementation within a single-wafer plasma processing system 10. According to FIG. 1, external magnetron module 12 mounts outside vacuum above stainless steel vacuum base plate 16 and main section of the multipurpose chuck 20. Stainless steel support vacuum base plate 16 provides vacuum seal for process chamber and engages quartz chuck jacket 22. Beginning at the upper left portion of FIG. 1 beneath magnetron module 12, inert gas (helium or argon) purge line 24 comprises a bore 25 through vacuum plate 16. The inert gas purge line provides a low gas flow purge between the bottom face of the vacuum base plate and the top face of the quartz jacket. The small gap between the vacuum base plate and the quartz jacket reduces any direct heat transfer between the main body of the multipurpose chuck and the water-cooled vacuum base plate. The main portion of the multipurpose chuck enclosed in the quartz jacket can experience temperatures in the desired operating range ($-150°$ C. to $750°$ C.); however, the vacuum base plate maintains a fairly constant temperature due to water cooling, relative thermal insulation from the main chuck, and its larger thermal mass compared to that of the main chuck. Besides the small vacuum gap, the quartz jacket provides an additional thermal insulation between the vacuum base plate and the main portion of the multipurpose chuck. Due to the high reflectivity of the electro-polished stainless steel vacuum base plate, the radiative component of heat transfer between the main chuck and the vacuum base plate is rather small. The gap purge flows radially over the quartz jacket and prevents formation of any plasma-induced deposits in the cylindrical spacing between the main chuck and process chamber 14. RF contact 26 penetrates through vacuum plate 16 via an RF feedthrough and connects to RF plate of multipurpose chuck 20. Although shown on the edge, the RF feedthrough may be placed at the center of the vacuum base plate. Coolant inlet 28 connects through vacuum plate 16 to the coolant block in the interior of chuck 20. Heater wire 30 electrically connects (via an electrical feed through) through vacuum plate 16 to chuck 20. Spring-loaded thermocouple 32 takes a temperature signal from chuck 20 Heater wire 34 taps from chuck 20 and exits through vacuum plate 16 (via another electrical feed-through). From the interior of chuck 20, coolant outlet 36 begins and continues through vacuum plate 16. Auxiliary chamber walls 38 seal to vacuum base plate 16 and surround process chamber 14 with a vacuum shield. Within auxiliary chamber walls 38, chuck vacuum base plate 16 seals to process chamber wall 40 at chamber vacuum seal 42. If necessary, all the chuck feed-throughs (RF, coolant, heater) can be made at the center with proper thermal and electrical insulations. Only the RF and heater feed-throughs need to be electrically insulated from the vacuum base plate. The coolant inlet/outlet can make direct physical and electrical contact to the vacuum base plate (system electrical ground). The coolant, heater, thermocouple, inert gas and RF power connections may all run from the center of the chuck via the center of the magnetron module towards the peripheral facilities. Moreover, as explained later, the chuck coolant block may employ multiple (two) inlets and multiple (two) outlets. The chuck coolant lines can be connected to grooves made in the vacuum base plate 16 in order to use the vacuum base plate 16 as a heat exchanger. Both the vacuum base plate and the coolant are connected to the system electrical ground and properly insulated from the RF power connection.

Basic elements of multipurpose chuck 20 include cooling module 44 which incorporates liquid or compress gas coolant tunnels 46. Heating element 48 is separated from the cooling module 44 by a thin (e.g. 0.060") thermally conducting electrically insulating boron nitride wafer (not shown) and makes electrical contact with heater wires 30 and 34. Heating element 48 is placed adjacent to the quartz jacket and is thermally insulated from vacuum base plate 16. RF plate 50 integrally connects to a thermally conducting electrically insulating boron nitride wafer (not shown) at the bottom side of cooling module 44 opposite that of heating element 48 and connects to RF power contact 26. Semiconductor wafer 52 is clamped against the RF plate 50 and quartz wafer holding pins 54 hold wafer 52 in place inside the plasma processing module. The RF plate 50 provides radial and circular grooves on its bottom surface in order to allow flow of a purge gas such as helium or argon resulting in improved thermal contact between wafer and chuck. The inert gas grooves on the bottom face of the RF plate 50 are connected to a center hole which is used both for a thermocouple and the wafer backside purge. The thermocouple junction is electrically insulated from the RF plate by a small boron nitride pin. The two boron nitride wafers (0.040" to 0.100" thick) in the multilayer stacked chuck structure provide proper electrical insulation between the RF plate and the coolant module as well as between the coolant module and the heater plate. There will be some capacitive RF coupling between the RF plate and the ground coolant block; however, this effect can be controlled by proper choice of the boron nitride buffer plate thickness and the external RF tuning circuitry. Anodized aluminum or stainless steel ground counterelectrode 56 consisting of a flat plate and a cylindrical extension component surrounds wafer pins 54 and contains quartz or metallic gas shower head 58. Gas shower head 58 provides one path for process gas injection. Sapphire or quartz tube 60 provides a second gas injection path for remote microwave (or RF induction) plasma stream 62 to enter process chamber via ground electrode 56. Microwave cavity 64 surrounds sapphire or quartz discharge tube 60 which receives gas from gas inlet 66 to generate plasma stream 62. Auxiliary chamber wall 38 seals to vacuum base plate 16 and surrounds process chamber wall 40. This arrangement provides an improved vacuum integrity for process chamber due to the fact that the space between process chamber collar 40 and auxiliary chamber 38 is pumped down. The vacuum shield between process chamber collar 40 and auxiliary chamber 38 is also connected to the load-lock chamber vacuum (not shown).

Figure 2:
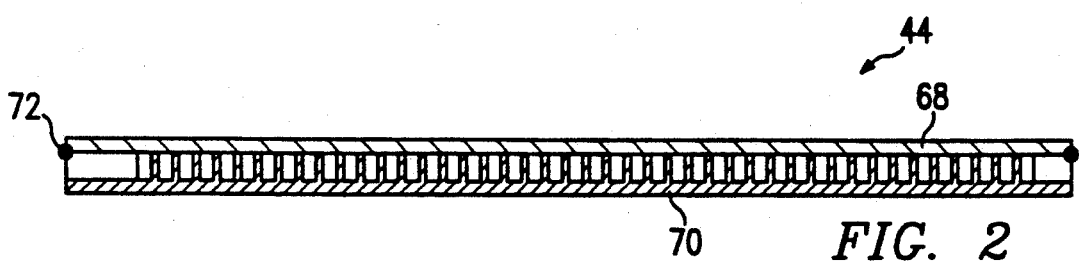
FIG. 2 is a cross-sectional view of a preferred embodiment of the multipurpose chuck coolant module.

FIGS. 2 and 3 more particularly show the construction of cooling module 44 within chuck 20. FIG. 2 is a cross-sectional schematic view of coolant module 44 showing it to comprise a top metal (such as aluminum or copper or nickel or molybdenum) plate 68 and a bottom metal plate 70 made of a similar material as the top plate. Bottom metal plate 70 mechanically seals to top metal plate 68 at welded joint 72 and contains coolant tunnels 46.

FIG. 3 provides a planar view of a suggested groove pattern in the bottom plate 70 that demonstrates the metal groove pattern 74 for coolant flow through coolant tunnels 46. In bottom plate 70 there are two separate sets of coolant tunnels 46. One set uses coolant inlet 28 and coolant outlet 36 (also shown in FIG. 1), another uses coolant inlet 76 and coolant outlet 78 (not shown in FIG. 1). The superimposed combination of these two coolant tunnels is expected to result in uniform transient and steady-state wafer cooling using a gas cooling medium such as air or helium or a liquid coolant. Various other coolant groove patterns may be used. The coolant module may be made of anodized aluminum (for a low-temperature chuck) or nickel-plated copper (for a high-temperature chuck). Other choices of coolant module materials include refractory metals such as nickel or molybdenum. If anodized aluminum is used in the cooling module 44, the chuck can be used over a temperature range of $-150°$ C. to $+500°$ C. On the other hand, nickel, molybdenum, or copper extend the upper temperature limit to beyond $750°$ C.

Figure 5:
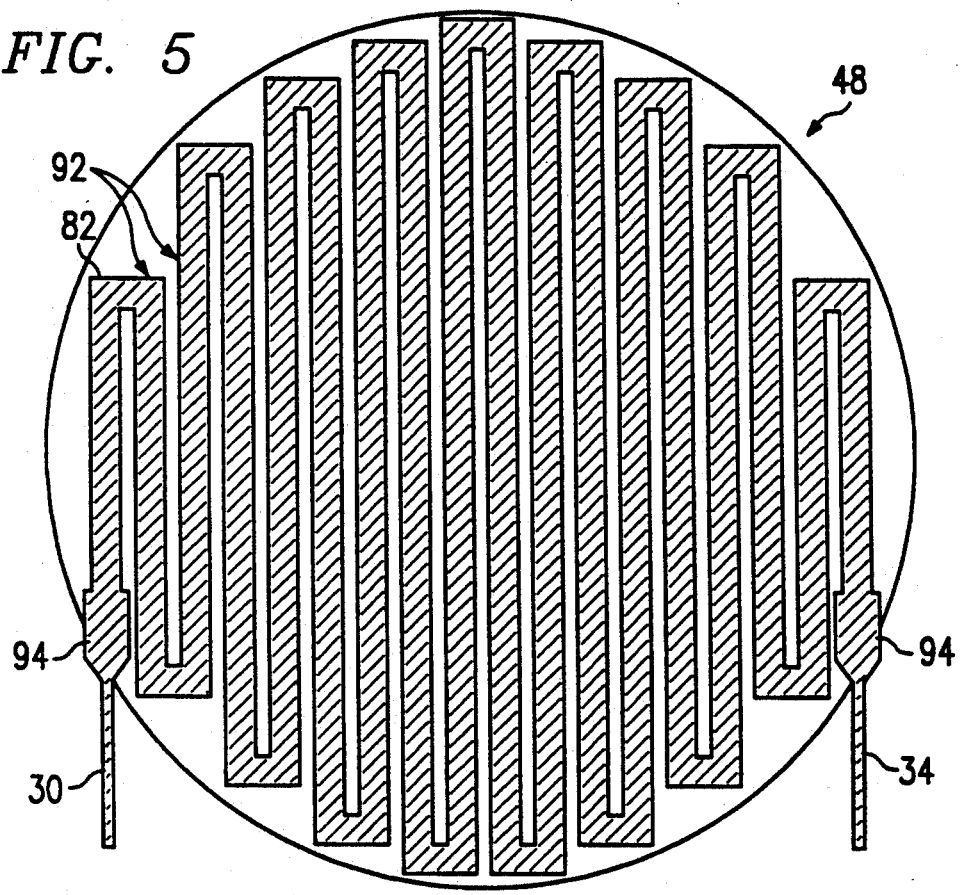
FIG. 5 shows a planar view of a preferred embodiment of the multipurpose chuck power heating element.
Figure 4:
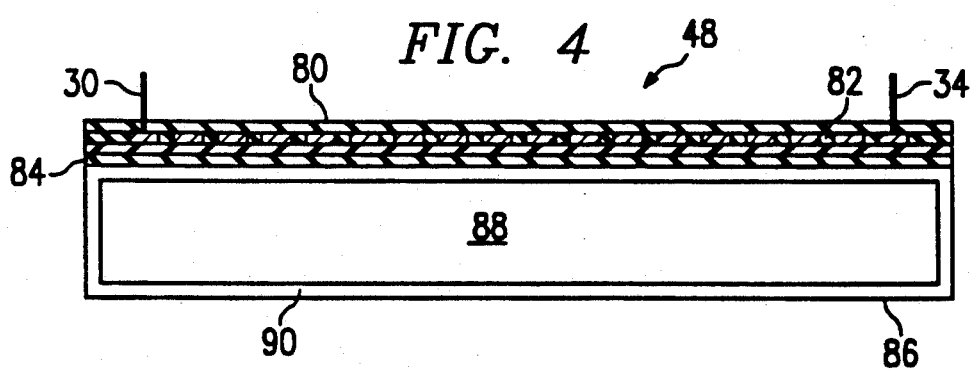
FIG. 4 is a cross-sectional view of a preferred embodiment of the multipurpose chuck heating plate.

FIGS. 4 and 5 show the construction of heating element 48. FIG. 4 is a cross-sectional view of heating element 48 exhibiting top layer 80 of electrical insulation and passivation through which heater wires 30 and 34 contact resistor line 82. Bottom layer 84 of electrical insulation integrally joins top layer 80 and heater substrate wafer 86. Heater substrate wafer 86 comprises graphite wafer 88 which SiC-coating 90 surrounds. FIG. 5 shows a planar view of top layer 80 and displays the pattern that thin-film power resistor line 82 makes to form a one-zone power heating resistor 92. Alternative patterns may be used for multizone wafer heating. Contacts 94 provide electrical connection between heater wires 30 and 34 and resistor line 82. Electrical contact can be made via spring loading the wire. The heater substrate 86 may be also made of boron nitride or even quartz. Boron nitride is a good choice of heater substrate material because of its high thermal conductivity and electrical insulation. The heater resistor can be made of a refractory metal such as tungsten, tantalum or molybdenum.

Figure 6:
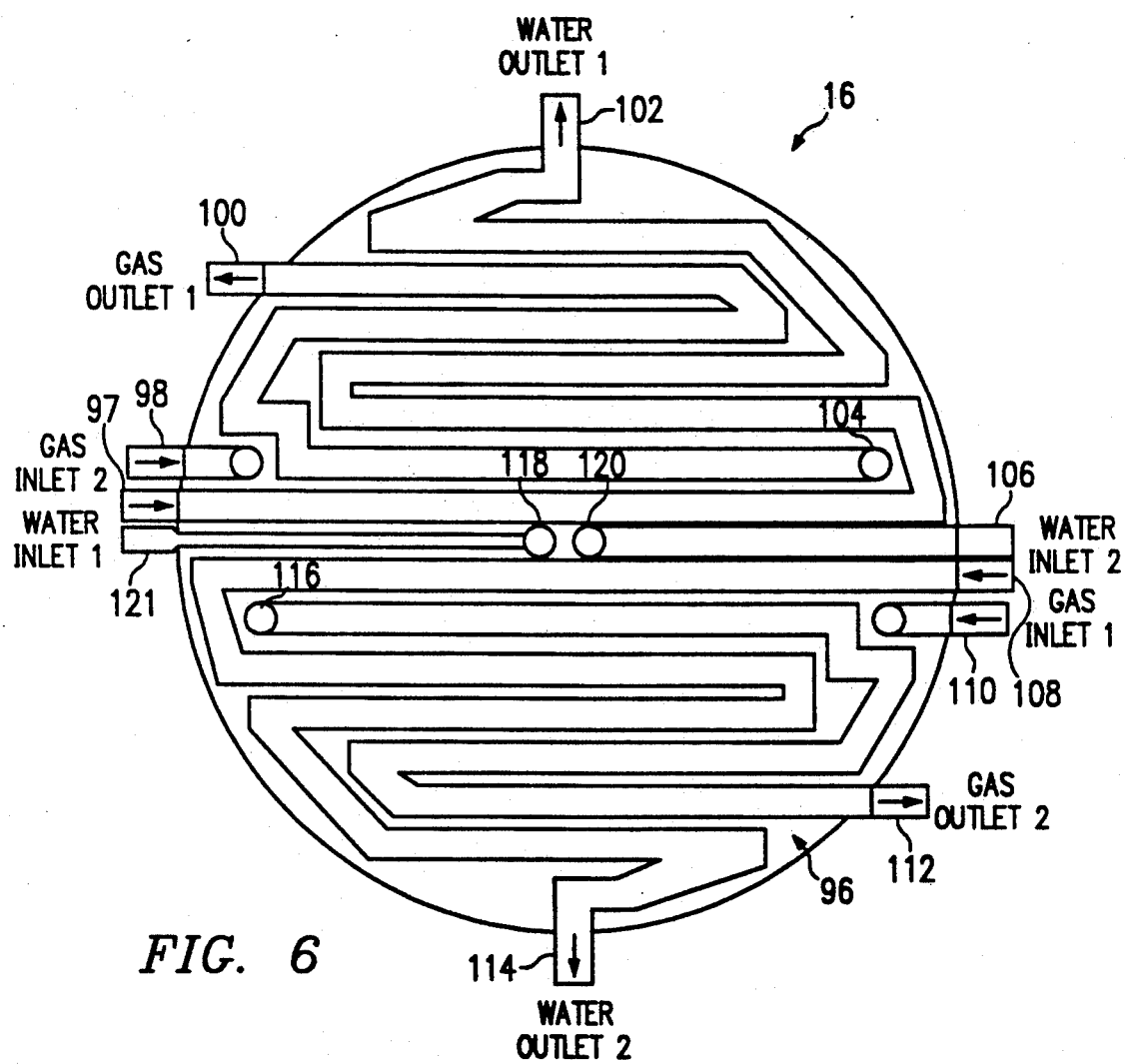
FIG. 6 shows a planar view of a preferred embodiment of the stainless steel vacuum support plate.

FIG. 6 shows a planar view of the water cooling and coolant groove pattern on the lower section of the stainless steel vacuum base plate 16. Grooves 96 cover vacuum plate 16 for both chuck coolant (air, helium or a liquid) and base plate water cooling. Moving clockwise, at the left center side of FIG. 6, inlet 97 sends water coolant through support base plate 16 and to the wafer coolant outlet 1 102. Coolant inlet 98 permits introduction of chuck coolant fluid (air or helium) through vacuum plate 16 and into the coolant block of the multipurpose chuck. Coolant outlet 112 receives heated coolant fluid from the cooling block of multipurpose chuck (gas outlet 2) via vacuum feed-through 116. Coolant outlet 102 receives coolant water from the vacuum base plate. Inert purge gas (helium) from multipurpose chuck 121 pass through support base plate 16 by passing through vacuum feed through 118. Thermocouple connection tunnel 106 permits electrical connection to a thermocouple for sensing chuck 20 temperature via a feed-through 120 as well as an inert gas flow for wafer backside thermal contact. Coolant inlet 108 provides a second path for coolant water flow within the vacuum base metal plate 16. Chuck coolant inlet 110 is one of the two coolant gas inlets for heat removal from multipurpose chuck. Coolant fluid flows out of the cooling block of the multipurpose chuck via outlet 100. Coolant outlet 114 permits coolant water to pass through support vacuum base plate 16. Vacuum feed-through 116 receives heated coolant fluid from cooling block and directs the fluid via grooves in vacuum base plate 16 to gas outlet 112. The water-cooled vacuum base plate also acts as a heat sink or a heat exchanger for the coolant fluid channels connected to the cooling block of the chuck. Near the planar center of vacuum base plate 16 appears inert purge feed-through 118. Thermocouple feed-through 120 also appears at the vacuum base plate 16 planar center and penetrates vacuum base plate 16 and connects to thermocouple connection 106 with proper wire insulation. The vacuum base plate 16 is made of a thicker lower section with grooves and a thin flat top plate. The two thin plates are brazed and/or welded together in order to trap and seal the grooves within the bulk of the base plate 16. The RF connection feed-through can be placed at the center of the vacuum base plate 16 (not shown).

Multipurpose chuck 20 provides electrical contact between RF plate 50 and an RF power source (not shown) via RF contact 26, but at the same time passes the magnetic field distribution from magnetron module 12. Also, multipurpose chuck 20 provides for fairly rapid heating and cooling of semiconductor wafer 52. Therefore, the thickness and magnetic properties of RF chuck 20 can affect the magnetic field uniformity and field strength that the semiconductor wafer 52 sees within process chamber as well as the ultimate plasma density and process uniformity for the plasma and MPE processes.

Multipurpose chuck 20 is designed as a low-thermal-mass thin chuck for maximum MPE processing throughput and uniformity. This occurs when the greatest amount of magnetic flux lines effectively penetrate the chuck to affect plasma ion formation near the semiconductor wafer 52 face. Accordingly, the chuck of the present disclosure has a thickness of less than one-half that of most conventional plasma processing chuck. The total thickness of the chuck of this disclosure including the entire vacuum base plate can be as small as about 1.25".

Another design consideration for multipurpose chuck 20 is that it be able to rapidly heat and cool semiconductor wafer 52. For transferring thermal energy to the semiconductor wafer 52 and achieving uniform wafer heating and cooling, therefore, the chuck 20 thermal mass should be large compared to that of semiconductor wafer 52. However, for rapid wafer heating and cooling, or short thermal transients, the thermal mass should not be excessively large. Additionally, for maximum energy transfer from heating plate 48 and heat extraction from the cooling module 44, respectively, chuck 20 employs two high thermal conductivity electrically insulating disks (boron nitride) to separate the heater from cooling block and the cooling block from RF plate 50 (for electrical insulation).

Fully understanding how multipurpose chuck 20 achieves these design objectives is best understood by appreciating its fabrication. In particular, the fabrication methods for heating element 48 and RF plate 50 demonstrate how chuck 20 achieves the above design objectives. Fabricating heater element 48 of chuck 40 calls for the use of thin film deposition technology on a substrate made of boron nitride, SiC-coated graphite, or quartz wafer. The starting material for heater element 48, therefore, is a 1/16" thick, 7"-8" diameter substrate (for 6" wafer processing). To fabricate heating element 48, first deposit multiple layers of silicon oxide (1 $\mu$m $SiO_2$), then silicon nitride (1000 Å $Si_3N_4$), then silicon oxide (1 $\mu$m $SiO_2$) on heater substrate by sputtering or CVD. This multilayer insulator acts as a buffer barrier and passivation layer (particularly on graphite or boron nitride). Then apply a layer of silicon (1000 Å Si) on these layers. Silicon layers act as an adhesion promoter. Sputter a 3 micron thick (or more) layer of tungsten (or other refractory metal) on the silicon layer, and then pattern the tungsten using either a lift-off or conventional patterning technique to produce power resistor 92. Deposit a thick layer of silicon oxide (1 $\mu$ $SiO_2$), silicon nitride (1000 Å $Si_4$), and silicon oxide (1 $\mu$m $SiO_2$) on the substrate as passivation overlayer. Then, open contact holes in this layer for electrical connecting heater wires 30 and 34 via contacts 94. Electrical connections may be made via electron beam welding or spring leading of wire, on contact region. Heater wires 30 and 34 will pass vertically through the contact holes in the quartz support module 22 and vacuum plate 16. The pattern shown in FIG. 5 indicates a one-zone heater. In practice, two or three-zone heaters may be preferred for optimized process uniformity.

An example of how to determine the necessary physical dimensions of the tungsten wires for the heater assembly is helpful for fabricating chuck 20. The resistivity, $\rho$, of tungsten wire at room temperature is 5 $\mu\Omega$ cm. Assume, for example, that the wire thickness, t, equals 2 $\mu$m. Then, for a maximum $T_{max}$=750° C., a wafer with an emissivity of 1.0 will emit about 7 watts/$cm^2$ from both surfaces. Thus, assume that the maximum blackbody radiation loss from one side approximately equals 4 W/$cm^2$. Therefore, design the heater block for a power rating of 5 W/$cm^2$. If we use a 7" circular RF plate in the chuck, its area is 248 $cm^2$. Thus, its maximum steady-state power dissipating, $P_{max}$, will be 1240 watts (=248 $cm^2 \times 5$ W/$cm^2$). Therefore, design the heater for a maximum power dissipation of at least 1250 watts. However, this is a lower limit of the maximum power required for steady-state heating at the desired peak process temperature (e.g., 750°). Rapid heat-up transients usually require transient heating power levels several times larger than the steady-state power level (e.g., 3-5× larger power).

With this level of power dissipation, the next step is to calculate the necessary tungsten heater wire length for power resistor 92. Assume that there are n wires distributed uniformly in parallel on a 7" graphite wafer. Further, assume that the peak rms voltage across the tungsten wire equals 115 V. Then, for a $P_{max}$ value of 1250 watts, the maximum current, $I_{max}$, equals $1250/115 \approx 11$ A. For this current flow, the proper resistance, $R = V/I_{max} = 115$ V/11 A $\approx 10$ Ω (assuming that the tungsten resistivity does not change with temperature which is not true).

To reduce power per unit length, maximize the resistor wire length. Let the wire length, L, equal approximately 240 cm, then the unit power dissipation will be approximately 5.2 Watts/cm $(=P_{max}/L = 1250$ W/240 cm.). For an arbitrary tungsten wire width, W, there are 240/W squares in the entire wire. For a resistance, R, of approximately 10 Ω, $R = R_s*240/W = p/t(cm)*240/W(cm)$, so the total area of a wire cross-section, W*t (cm²), equals $1.2 \times 10^{-4}$ cm², which results in a current density well below the electro-migration limit of tungsten wire. As a result, the tungsten wire is an excellent material as power resistor 82 for the purposes of chuck 20. These considerations may facilitate the fabrication of heater element 48. Other refractor metals (such as titanium or molybdenum), and refractory metal nitrides and silicides may also be used as heater material. The heater may be designed in a multizone configuration for the best heating uniformity results. Typically 3 or 4 heating zones are required in order to optimize the transient and steady state heating uniformity. Multi-zone resistive heaters can employ rings of resistive heaters with some cylindrical symmetry.

In a similar fashion, the following discussion may assist in fabricating RF plate 50 for chuck 20. RF plate connects to an RF source via RF contact 26 for a maximum RF power coupling of several hundred watts. To fabricate the RF plate with this capability, a preferred starting material for this portion of the device is a 7" conductive wafer made of SiC-coated graphite or a metal such as molybdenum with a thickness of about 1 mm. An anodized aluminum plate may be used for a chuck with a maximum heating temperature of 500° C. In another preferred embodiment the RF plate comprises a graphite wafer with a layer of titanium covering one side only of the graphite wafer. The plate further comprises a layer of tungsten covering the titanium layer, a first silicon oxide layer covering the tungsten layer, a silicon nitride layer covering the oxide layer and a second silicon oxide layer covering the nitride layer.

Three technical advantages of t new and novel chuck 20 of the present invention relate to plasma process throughput and uniformity. First of all, chuck 20 has a low thermal mass that reduces thermal transient times for wafer heating and cooling. Secondly, the cooling block and heating plate configurations disperse the respective heat removal and heat generation capabilities of chuck 20 across its planar face. This assures uniform cooling and heating of semiconductor wafer 52, both during transient and steady-state conditions. Thirdly, RF plate 50 provides a uniform radio-frequency electromagnetic power across the chuck 20 planar surface. These design considerations support plasma processing rate and uniformity across the semiconductor wafer 52 planar surface.

To promote MPE process uniformity even further, a novel magnetron plasma module 12 has been designed. Also, the new magnetron module is disclosed and described in U.S. patent application Ser. No. 07/771/506, pending, entitled "DISTRIBUTED-ARRAY MAGNETRON-PLASMA PROCESSING MODULE" by Messers. Moslehi and Davis, filed concurrently with this application. The disclosure and claims of that U.S. Patent Application are hereby expressly incorporated by reference herein.

Figure 7:
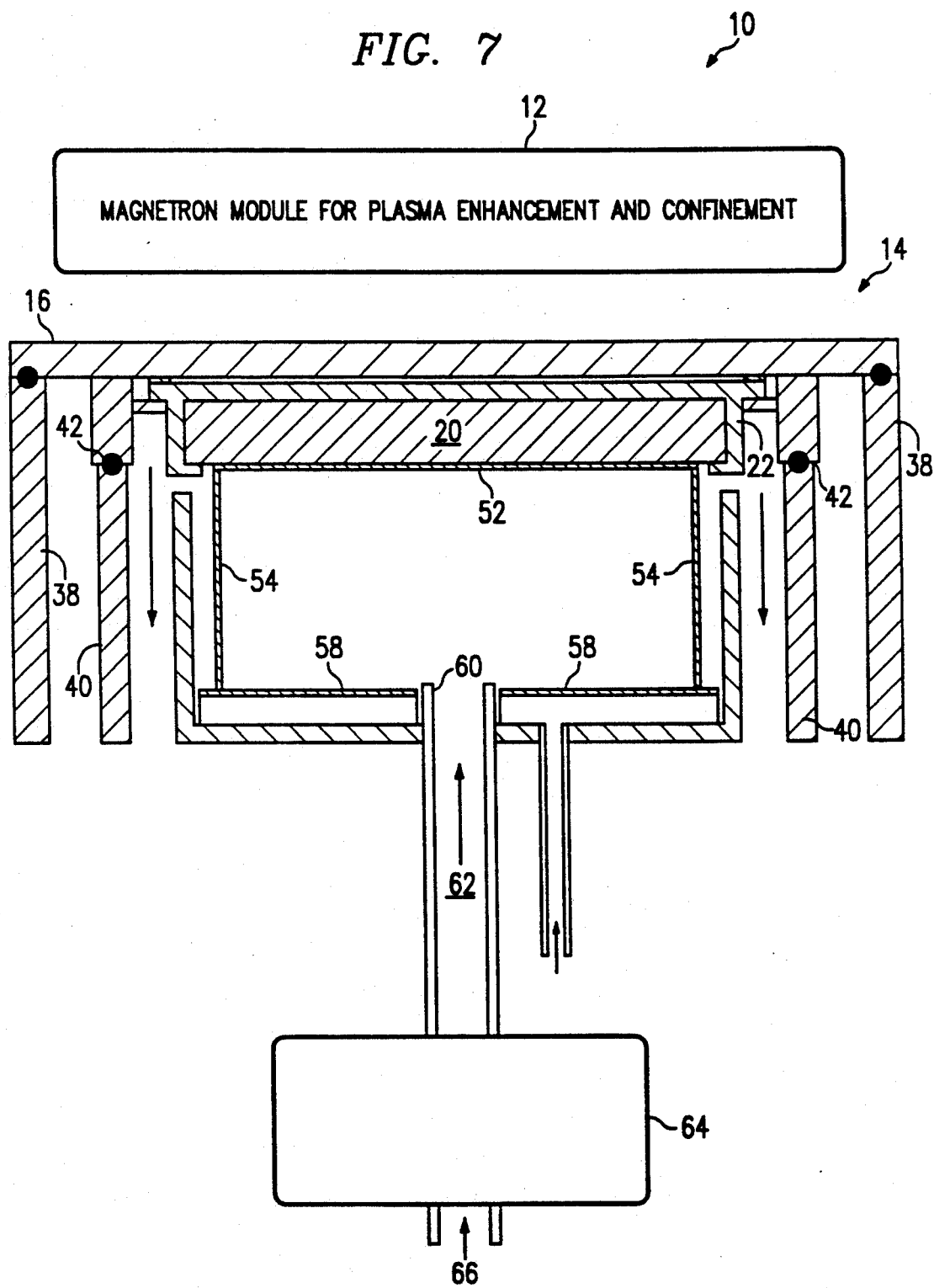
FIG. 7 is a partially broken-away schematic view of a single-wafer plasma processing system showing use and placement of the magnetron module of the present invention (face-down wafer processing)

FIG. 7 illustrates the schematic view of a single-wafer magnetron plasma processing system 10 along with the proper placement of the magnetron module of the present invention outside the vacuum environment over the process chamber 14. The plasma processing system 10 basically includes magnetron module 12 which mounts to process chamber 14. The vertical distance between the magnet assembly 12 and the process chamber 14 can be adjusted. Process chamber 14 comprises water-cooled stainless steel vacuum base plate 16 which engages quartz support module 18. Quartz support module 18 firmly holds multipurpose low thermal mass chuck 20 in place so that multipurpose chuck module 20 contacts semiconductor wafer 52. Three or four quartz wafer holding pins 54 clamp and support semiconductor wafer 52 and hold the wafer in good thermal and electrical contact with chuck 20. Process chamber wall 40 seals to vacuum plate 16 by way of process chamber vacuum seal 42. Anodized aluminum ground electrode 56 (made of a flat plate and a cylindrical segment) surrounds wafer pins 54 and contains a cylindrical section along with the quartz gas shower head 58. Sapphire or quartz tube 60 provides a path for microwave plasma stream 62 to enter process chamber via the hole in the ground electrode 56. Microwave cavity 64 generates a plasma gas discharge for the gas coming from gas inlet 66 and results in plasma stream 62. Auxiliary chamber wall 38 seals to vacuum base plate 16 and surrounds process chamber wall 40 by producing a vacuum shield. The vacuum shield space between the auxiliary chamber wall 38 and the process chamber collar 40 is connected to the load-lock chamber vacuum (not shown).

The total surface area of the anodized aluminum (or stainless steel) ground electrode (also called "counter electrode"), which consists of the cylindrical and flat shower head surface areas, is a factor in determining the self-induced DC bias during plasma processing; larger counter electrode surface areas result in larger self-induced DC bias and more energetic ions. The total diameter or surface area of the shower head 58 should be made at least as large as the wafer 52 or the multipurpose chuck 20. As a result, the height of the cylindrical section of the counter electrode may be adjusted to optimize the DC bias and ion energies during magnetron-plasma-enhanced processing.

Figure 8:
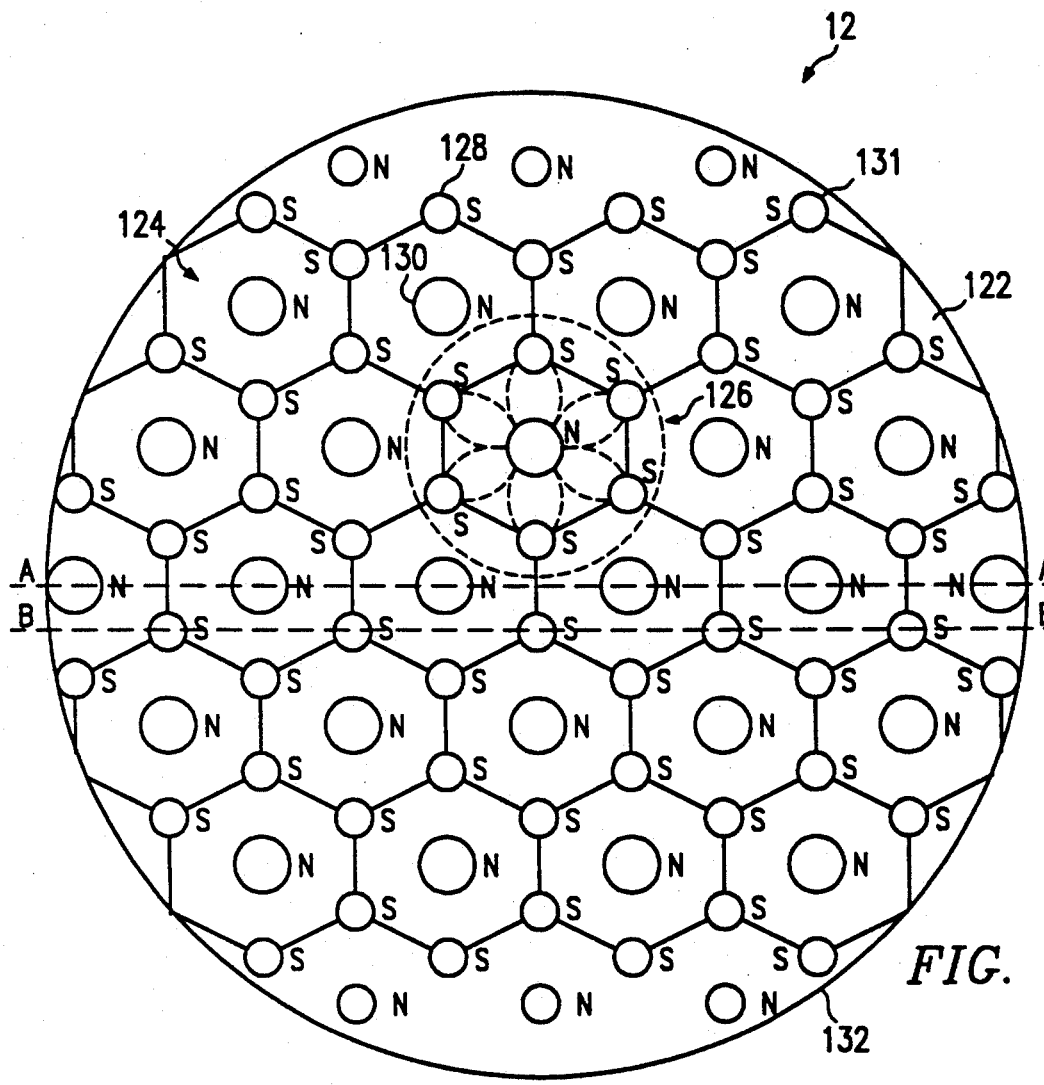
FIG. 8 shows a planar view of a preferred embodiment of the hexagonal-array magnetron module of the present invention.
Figure 9:
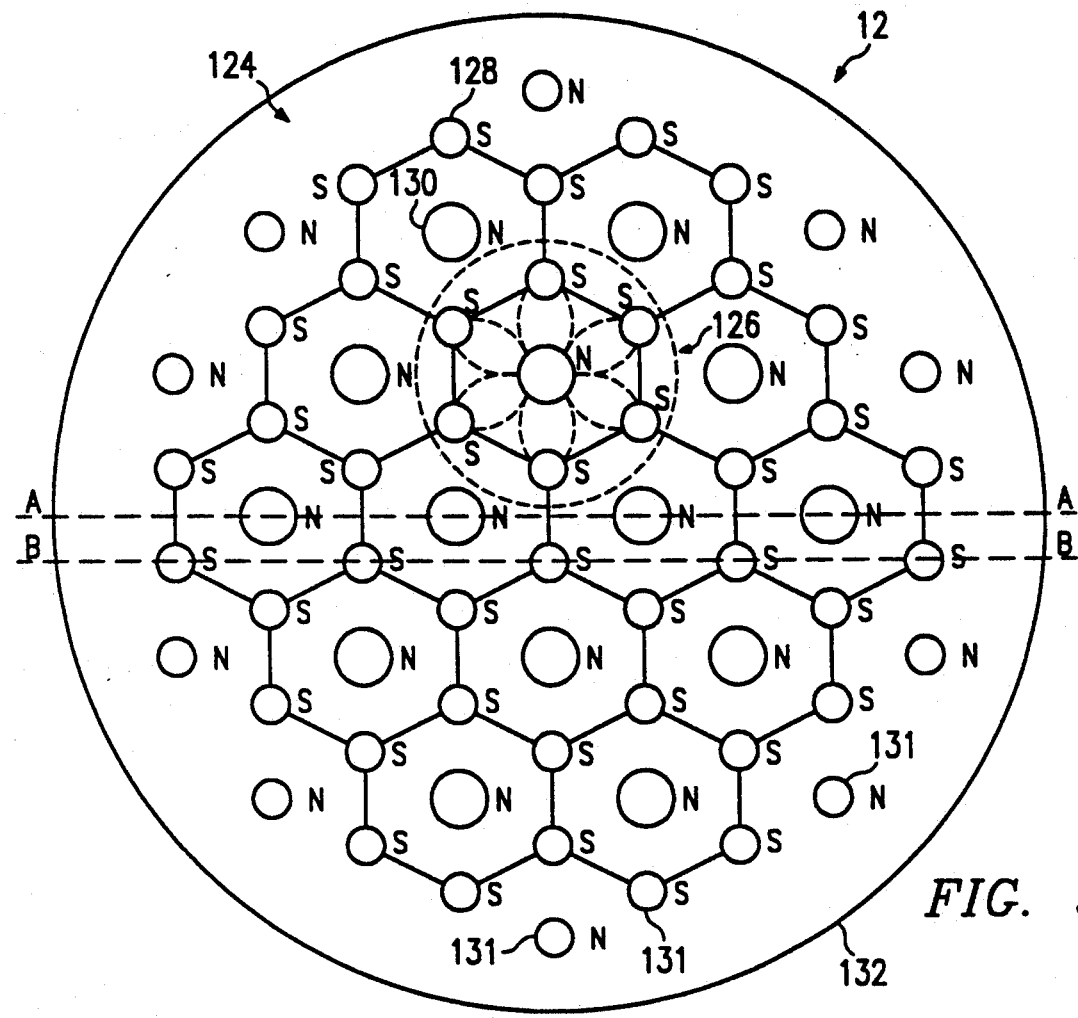
FIG. 9 provides a planar view of a preferred embodiment of the hexagonal-array magnetron module of the present invention with a different boundary arrangement and termination of the magnets at the periphery of the circular magnetic assembly.

FIGS. 8 and 9 show two planar views of a preferred embodiment of the hexagonal-array magnetron module 12 of the present invention. Magnetron module 12 includes soft magnetic material iron base plate 122 and magnetic array 124. Magnetic array 124 comprises a plurality of unit cells 126 (surrounded by the dash line) adjoining one another. Each of the unit cells 126 comprises outer unit cell magnets 56 and a central unit cell magnet 130. These appear throughout the array from the planar center on out to edge 132. Magnetron module 12 of the preferred embodiment comprises a magnetically conductive (e.g. iron) base plate 122 to which magnetic array 124 integrally mounts. In the preferred embodiment, iron is the material for base 122, however, other materials having similar magnetic conductivity and strength properties can be used. The lines connecting the adjacent magnets are only imaginary lines drawn to highlight the distributed array structure.

Hexagonal unit cells 126 are repeated to form a periodic pattern across magnet array 124 and comprise a plurality of cylindrical magnets 128 that produce a periodic magnetic field at the semiconductor wafer 52 face. In the preferred embodiment of the present invention, each unit cell 126 is of identical cell size and outer magnets 128 surround a central unit cell magnet 130 in a hexagonal pattern. Adjoining unit cells 126 share outer magnets 128 so that each outer magnet 128 contributes as a part of the hexagonal pattern for three neighboring unit cells 126 (except at the edge of the magnetron assembly). The magnetic array field comprises a sum of the smaller unit cell magnetic fields that are dispersed throughout the array, so there are no discrete major global sources for the magnetron magnetic field as with conventional magnetrons. The magnetic field of the magnet array possesses a two dimensional periodicity because the total magnetic field that the magnetron module produces is the sum of the fields of the smaller unit cells, and the smaller unit cells have dimensions which are small compared to the chuck or wafer diameter, but larger than the total chuck and base plate thickness (>1").

The result of the repetitive unit cell 126 magnetic fields and the sharing of outer magnets 128 for each unit cell 126 is a periodic magnetic field across the entire magnet array 124. Additionally, unit cells 126 associate to permit expansion of magnet array 124 by further addition of unit cells that provide a uniform magnetic field. Thus, for any size fabrication chamber and wafer diameter, magnetic array 124 can be made any size necessary for the particular fabrication chamber. The unit cell dimensions (e.g. hexagonal side dimension) are determined by the distance between the free-standing magnet poles and the wafer (or total chuck and base plate thickness) and the transverse magnetic field strength required at the substrate surface. A typical intermagnet (unit cell radius) spacing is 20 mm to 50 mm.

The total number of unit cells in a magnetron assembly is determined by the unit cell radius and the size or diameter of the wafer chuck. The diameter of the magnetic assembly used in the magnetron module is chosen to be at least as large as the diameter of the wafer chuck (usually chosen to be somewhat larger). The preferred embodiment of this invention employs an 8" to 10" magnetron for 6" wafer processing. The ideal forms of the distributed-array magnetron modules employ infinite number of unit cells over an infinite two-dimensional plane, resulting in a periodic magnetic field distribution. However, in practice, the distributed-array magnetron nodules have a finite size (e.g., diameter for circular modules) and, as a result, have a well-defined boundary which interrupts the two-dimensional periodic array. It is important to arrange the boundary magnets in the distributed-array magnetron modules such that the field discontinuity at the boundary does not propagate a non-periodic magnetic field into the magnetron plane. In both hexagonal-array designs shown in FIGS. 8 and 9, the boundary magnets have proper arrangement and size (cross-sectional area) in order to ensure field periodicity within the magnetron module. For instance, six of the boundary magnets 131 with north (N) free standing poles in FIG. 8 have smaller cross-sectional areas (by a factor of 2) compared to the magnets of similar polarity within the hexagonal-array module.

Magnet array 124 uses a periodic structure of the unit cells 126, however, the periodic structure must stop at certain points along the edge 132 of the magnetron. The field periodicity and distribution at the edge may not be particularly the same as the uniform field throughout an infinite magnetron. These non-uniformities could propagate into the center of the magnetron. In the preferred embodiment of the invention, magnet array 124 appears within magnetron module 12 so that the magnets form around edge 132 in a way that avoids global non-uniformities. This is achieved by properly positioning, with respect to edge 132 and 128 and 130 that appear in their proper half unit cell positions. Each of the magnets 59 at the boundary only interact with three nearest magnets, of opposite polarity and, as a result, have smaller cross-sectioned areas compared to the inner magnet, of similar polarity 130. By establishing these boundary conditions, no global magnetic field non-uniformities propagate to the center of the magnetron 12 from the edge 132. This will allow building a distributed-array finite size magnetron modules which behave similar to the infinite site arrays with identical unit cell configurations. The magnetron module of FIG. 9 shows a slightly different boundary magnet arrangement compared to that in FIG. 8.

Magnets 128 and 130 may be electromagnets or permanent magnets. The preferred embodiment employs permanent magnets. When the device uses permanent magnets, ceramic magnets, high-energy rare-earth magnets, or alnico magnets are preferable. Irrespective of the magnetic material, the resulting field from the magnets should be sufficiently strong to create a strong magnetron enhancement effect at the semiconductor device. One factor affecting the magnetic flux density is the height and cross-sectional area of the magnets. The discussion that follows later in this disclosure specifies the minimum necessary magnetic field strength for MPE processing. At this point, however, the reader should understand that the magnetic field strength of magnets 128 and 130 near the semiconductor water takes into consideration factors such as the chuck thickness, the necessary magnetic field strength for maximum plasma confinement and the pressure regime of the particular plasma process. Typical magnet heights are in the range of 1" to 8". The magnet cross-sectional areas should be small compared to the unit cell area.

Figure 10:
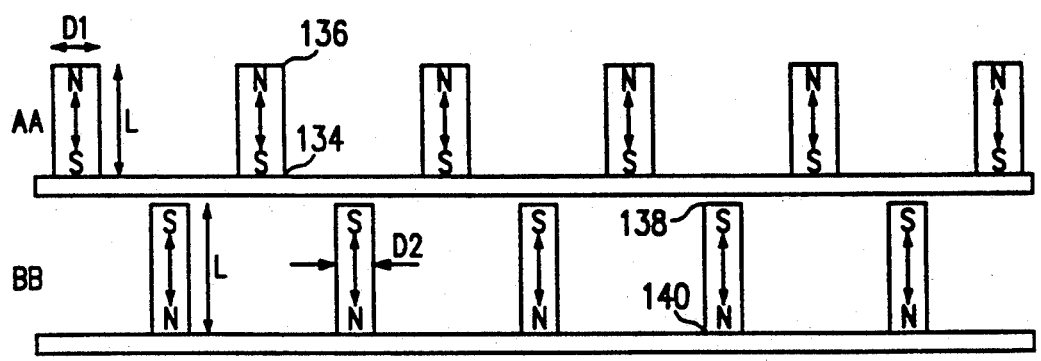
FIG. 10 shows a cross-sectional view of the preferred embodiment of the magnetron module shown in FIG. 8 (along the A—A and B—B axes)
Figure 11:
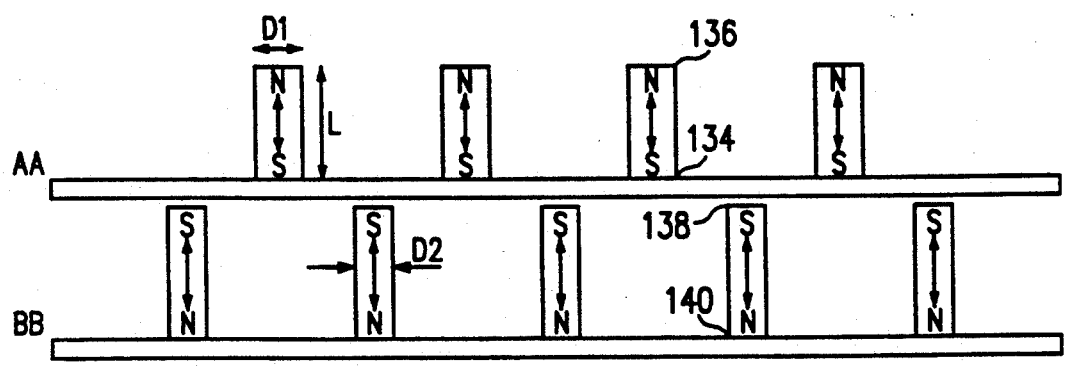
FIG. 11 shows a cross-sectional view of the preferred embodiment of the magnetron module shown in FIG. 9 (along the A—A and B—B axes)

FIGS. 10 and 11 show two cross-sectional side views of magnetron module 12 of FIGS. 8 and 9, respectively. Cross-section A—A shows the central unit cell magnets 58 with north polarity free-standing poles. Cross-section B—B shows some of the outer unit cell magnets with the opposite polarities (south). Each central unit cell magnet south pole 139 (magnets on hexagonal unit cell centers), in the preferred embodiment, mounts to the soft magnetic material base plate 122. With this design, the associated central unit cell magnet north pole 136 (magnet on hexagonal unit cell centers), forms the free standing pole facing the vacuum base plate 16 when magnetron module 12 mounts to process chamber 14. Likewise, each outer unit cell magnet north pole 140 (magnets on hexagonal unit cell peripheries) mounts to base 122. Similarly, with this design the associated outer unit cell magnet south pole 138 forms the opposite free standing pole facing the vacuum plate 16 when magnetron module 12 mounts to process chamber 14. The result of this configuration is a magnetic field distribution that has a transvene component parallel to the semiconductor wafer 52 face during MPE processing with the present invention. The transverse magnetic field strength is maximum between the magnets and is minimum over the magnet poles.

Figure 12:
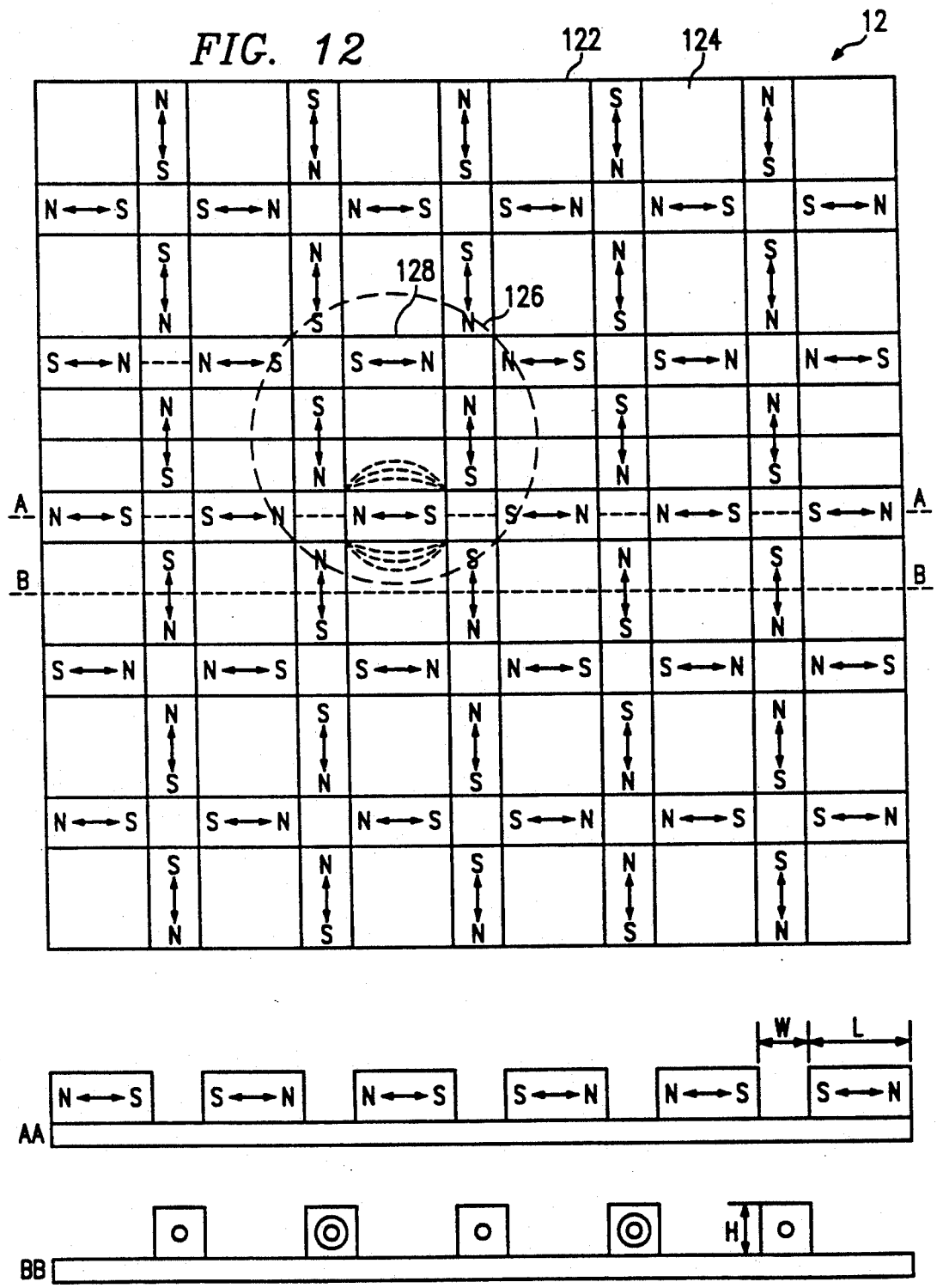
FIG. 12 shows an alternative embodiment of the magnetron module of the present invention using a distributed grid magnetic array.

FIGS. 12 through 15 show alternative embodiments of magnetron module 12 within the scope of the present invention. FIG. 12 shows a distributed grid array or plane array. Reference numerals for the alternative embodiments of FIGS. 12 through 15 relate to their original use in FIGS. 2 and 3. In the grid-array design 124, unit cells 126 comprise magnets 128 which are oriented in a plane parallel to the plane of support base 122. In grid-array module 124, the magnetic field emanates from one end of the magnet, across the chuck and then to the other end of the magnet. An important characteristic of the distributed grid-array magnetron is that base 122 comprises a magnetically nonconductive material, such as non-magnetic stainless steel. This prevents shorting the magnetic field of each magnet 128. The grid-array design 52 may be more desirable in instances where an application calls for a more economical array than the hexagonal array. Compared to the simpler arrangements (for instance, only one pair of bar magnets), the distributed periodic magnet field from the grid-array module 124 still provide much better global field uniformity and, therefore, better magnetron plasma process uniformity. The magnetron module shown in FIG. 12 can also have a circular boundary.

FIG. 13 shows a dot-matrix square magnet array 124 for magnetron module 12. Magnetron array 124 in this embodiment produces a magnetic field possessing periodic uniformity, but with a less efficient distributed field 60 than the hexagonal magnet array. As with each embodiment, the dot-matrix square magnet array 124 unit cells 126. These unit cells 126 each comprise four single pole base magnets 128 in a square or rectangular pattern. In each unit cell 126, two of the magnets 128 north poles attach to base 122 and two of magnets 128 south poles attach to base 122. The base plate 122 made of a soft magnetic material such as iron. This produces a periodic magnetic field 132 across the magnet module 12 face. Each magnet in the array shares its field lines, with its four nearest neighbors of opposite polarity.

FIG. 14 shows a magnetron module 12 with a distributed concentric ring magnet array 124. While the concentric ring is not a distributed array in the sense that it does not have repetitive unit cells 126 dispersed throughout the two-dimensional plane, it provides a radically distributed magnetic field. In this configuration, unit cells 126 are, in fact, cylinders of increasing diameters. This is not the case in other configurations. The concentric circle magnet array 124 provides cylindrical and radical magnetic field uniformity, but at an increased cost. This is because of the increased expense of fabricating large ring magnets 128 that the concentric magnet array uses. In instances where there is the need for large scale cylindrical symmetry, however, the distributed concentric ring configuration of FIG. 14 may be desirable. The number of ring magnets and their spacing are determined based on the chuck size, field strength and other factors.

FIG. 15 is a uniformly distributed multipolar magnetron source with cylindrical magnets. This configuration combines the features of the preferred hexagonal configuration with those of the concentric ring configuration.

Having described the preferred embodiment of multipurpose chuck 20 of the present invention and magnetron 12, the following paragraphs describe their use together. It should be remembered, however, that chuck 18 of the present invention will operate without the use of new and novel magnetron 12. Magnetron 12, on the other hand, significantly improves the overall performance of the chuck 20 of the present invention.

Semiconductor wafer 52 sets face-down against the surface of chuck 18 during processing and magnetron module 12 mounts to the top of the stainless steel vacuum plate 16. This arrangement will produce a magnetic field that is distributed across and mostly parallel to the wafer 52 surface. Although this particular configuration illustrates magnetron module 12 in use with a single-wafer reactor for face-down wafer processing, the MPE processing configuration of magnetron 12 and chuck 18 is applicable to any format of wafer processing in a fabrication reactor (e.g., face-up, face-down, or vertical).

In the implementation of the present invention, the material layers (stainless steel vacuum plate, quartz, multipurpose RF chuck) that separate the wafer from magnetron module 12 are nonmagnetic and do not affect the magnetic field distribution on the wafer 52 surface. Also, if necessary, magnetron module 12 can be moved vertically away from the stainless steel vacuum plate and the wafer in order to reduce the magnetic field strength at wafer 52.

As stated above, numerous factors determine the necessary magnetic field strength from magnets 128 and 130. The following discussion outlines these factors. During MPE processing, chuck 20 is connected to an RF power source. The RF power generates a plasma and a self-induced negative DC bias between the plasma and the semiconductor wafer 52 surface on the chuck. As a result of the transverse component of the magnetic field, electrons within the plasma follow the magnetic field lines that magnetron module 12 produces. Because of the perpendicular electric field and the transverse component of magnetic field, the magnetron condition is satisfied which results in enhanced plasma density and confined plasma near the wafer surface. The magnetron plasma discharge is produced by electron drift motion due to crossed electric and magnetic fields. The self-induced DC voltage generates an electric field perpendicular to the cathode or wafer surface. Moreover, the externally applied static magnetic field produces the necessary transverse magnetic field component parallel to the cathode. The electrons experience a cycloidal motion along a path that parallels the semiconductor wafer 52 face. Because of the cycloidal motion, the electron collision probability and plasma ionization efficiency increases. This tends to increase the plasma density and ion current density at the semiconductor wafer surface. The radius of the cycloidal path is known as the "Larmor radius". The Larmor radius, R, of an electron with an energy of V in a uniform transverse magnetic field can be calculated from the following relationship:

$$R = 33.7 \frac{V^{0.5}}{B} \text{ mm} \quad (1)$$

where B is the transverse magnetic flux density in Gauss and V is the electron energy in electron volts.

As indicated above, the Larmor radius is reduced with increasing the transverse magnetic flux density and/or decreasing the electron energy. The cyclotron frequency, f, in which the electron rotates is proportional to the transverse magnetic flux density and increases linearly as the transverse magnetic field strength increases according to the following equation:

$$f = 2.80 \times 10^6 * B \text{ (cycles/sec)} \quad (2)$$

Also, as the transverse magnetic increases, the self-induced negative DC bias decreases, and this causes electron energies to decrease. Thus, as the transverse magnetic field strength increases, the frequency increases, the Larmor radius decreases, and the average ion energy imparted on the semiconductor wafer is reduced.

In plasma processing applications, the magnetron enhancement effects due to the interaction of the plasma species with the magnetic field become significant when the Larmor radius, R, becomes less than the electron mean-free path, $l_e$. This ensures that the electrons are sufficiently confined along the magnetic field lines to enhance the plasma density and ionization efficiency via ionizing collisions with gas molecules.

The electron mean-free path, $l_e$, is inversely proportional to the plasma gas pressure (P in Torr) according to the following equation:

$$l_e = \frac{a}{P} \quad (3)$$

where a is a constant (units of Torr-cm). The value "a" is a function of the particular gas composition within the process chamber and can be considered the "mean-free path coefficient" of the gas within the chamber. Thus, as the pressure increases, the mean-free path will decrease.

In order to assure that the Larmor radius is less than the electron mean-free path, the following equation which combines equation (1) and (3), establishes a lower limit for the required transverse magnetic flux density.

$$B_{min} = 3.37 \frac{P V^{0.5}}{a} \text{ Gauss} \quad (4)$$

Therefore, higher process pressures and higher electron energies will require stronger magnetic flux densities for enhanced MPE processing efficiency. For typical process pressures and electron energies, the required magnetic flux density will be around 20-500 Gauss. Most magnetron-ion etching processes employ process pressures in the range of 1-20 mTorr for maximum etch anisotropy or zero undercut. However, the magnetron-plasma-assisted deposition processes may employ process pressures over a much wider range (e.g., up to several Torr).

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A multipurpose low-thermal-mass chuck for semiconductor processing equipment for plasma-enhanced processing of semiconductor wafers, comprising a stacked multi-layered structure of:
   a vacuum base plate for providing vacuum seal and mechanical support;
   a coolant module layer for extracting heat from the semiconductor wafer;
   a heating element layer adjoining said coolant module for heating said semiconductor wafer said heating element layer comprising a thin film resistor; and
   a radio-frequency plate for associating an electromagnetic radio frequency power source with the semiconductor wafer.

2. The radio-frequency chuck of claim 1, wherein said radio frequency chuck comprises the property of being nonmagnetic.

3. The radio-frequency chuck of claim 1, wherein said chuck has a thickness of less than 1.25".

4. The radio-frequency chuck of claim 1, wherein said radio-frequency chuck further comprises the property of being nonmagnetic; and
   said chuck has a total thickness of less than 1.25".

5. The radio-frequency chuck of claim 1, wherein said coolant module layer further comprises a plurality of coolant tunnels for permitting a coolant to flow and, thereby, cool the semiconductor substrate.

6. The radio frequency chuck of claim 1, wherein said coolant module layer further comprises a top plate and a bottom plate, said bottom plate coupled to said top plate and formed to permit a coolant to pass therebetween.

7. The radio-frequency chuck of claim 6, wherein said cooling module layer further comprises a plurality of coolant tunnels between said top plate and said bottom plate for coolant flow to cool the semiconductor wafer.

8. The radio-frequency chuck of claim 6, wherein said bottom plate further comprises a plurality of coolant tunnels for coolant flow to cool the semiconductor wafer.

9. The radio-frequency chuck of claim 5, wherein said coolant tunnels are associated to provide uniform cooling across said chuck.

10. The radio-frequency chuck of claim 1, wherein said heating element layer further comprises:
    a top layer of electrical insulation and passivation;
    a thin film power resistor for generating thermal energy to heat the semiconductor wafer;
    a bottom layer of electrical insulation adjoining said top layer an sealing therebetween said thin film power heating resistor; and
    a graphite wafer adjoining said bottom layer and structurally supporting said heating element.

11. The radio-frequency chuck of claim 10, wherein said graphite wafer further comprises a graphite substrate and a SiC coating surrounding said substrate.

12. The radio-frequency chuck of claim 10, wherein said power resistor further comprises a tungsten thin film for generating heat energy for the semiconductor wafer.

13. The radio-frequency chuck of claim 10, wherein said power resistor further comprises a tantalum thin film for generating heat energy for the semiconductor wafer.

14. The radio-frequency chuck of claim 10, wherein said power resistor further comprises a molybdenum thin film for generating heat energy for the semiconductor wafer.

15. The radio-frequency chuck of claim 10, wherein said power resistor further comprises a metal silicide thin film for generating heat energy for the semiconductor wafer.

16. The radio-frequency chuck of claim 10, further comprising a first boron nitride wafer between the cooling module and the heating element layer and a second boron nitride wafer between the cooling module and the Rf plate.

17. The radio-frequency chuck of claim 15, wherein said heating element further comprises:
 a top layer of electrical insulation and passivation;
 a thin film power resistor for generating heat energy to heat the semiconductor wafer;
 a bottom layer of electrical insulation adjoining said top layer and sealing therebetween said power resistor; and
 a graphite wafer adjoining said bottom layer and structurally supporting said heating element.

18. The radio-frequency chuck of claim 17, wherein said coolant tunnels form a plurality of parallel passages throughout said coolant module and said power resistor comprises a plurality of parallel or circular lines.

19. The radio-frequency chuck of claim 1, wherein said chuck further comprises an insulating jacket surrounding said chuck for holding said chuck and permitting said chuck to be positioned within a semiconductor device fabrication chamber.

20. The radio-frequency chuck of claim 1, wherein said radio-frequency plate further comprises
 a graphite wafer;
 a layer of titanium covering one side only of said wafer;
 a layer of tungsten covering said titanium layer;
 a first silicon oxide layer covering said tungsten layer;
 a silicon nitride layer covering said oxide layer; and
 a second silicon oxide layer covering said nitride layer.

21. The radio-frequency chuck of claim 1, wherein said radio-frequency plate comprises a refractory metal.

22. A semiconductor device plasma processing multi-layered radio frequency chuck for plasma-enhanced processing of a semiconductor device, comprising:
 a coolant module layer for extracting heat from the semiconductor wafer, said coolant module layer comprising a plurality of coolant tunnels for permitting a coolant to flow and, thereby, cool the semiconductor wafer, said coolant module further comprising a top plate and a bottom plate, said bottom plate coupled to said top plate and formed to permit a coolant to pass therebetween;
 a heating element layer adjoining said coolant module layer and separated by a buffer boron nitride wafer for heating said semiconductor wafer, said heating plate comprising a top layer of electrical insulation and passivation, a thin film power resistor for generating thermal energy to heat the semiconductor substrate, a bottom layer of electrical insulation adjoining said top layer and sealing therebetween said thin film power resistor;
 a wafer adjoining said bottom layer and separated by a buffer boron nitride wafer and structurally supporting said heating plate; and
 a radio-frequency plate for associating an electromagnetic radio-frequency power source with the semiconductor wafer, said radio-frequency plate comprising a graphite wafer, a layer of titanium covering one side only of said wafer, a layer of tungsten covering said titanium layer, a first silicon oxide layer covering said tungsten layer, a silicon nitride layer covering said oxide layer, and a second silicon oxide layer covering said nitride layer.

23. A system for magnetron-plasma-enhanced processing of a semiconductor wafer, comprising:
 a magnetron module; and
 a radio-frequency chuck, said chuck comprising a stacked multi-layered structure of:
  a vacuum base plate for providing vacuum seal and mechanical support;
  a coolant module layer for extracting heat from the semiconductor wafer;
  a heating element layer adjoining said coolant module layer for heating said semiconductor wafer said heating element layer comprising a thin film power resistor; and
  a radio-frequency plate for associating an electromagnetic radio-frequency power source with the semiconductor wafer.

24. The system of claim 23, wherein said magnetron module further comprises:
 a base; and
 a magnetic array mounted to said base, said array comprising a plurality of unit cells, said unit cells comprising a plurality of magnets associated to produce a uniform magnetic field at the device.

25. A system for magnetron-plasma-enhanced processing of a semiconductor wafer, comprising:
 a semiconductor device processing reactor;
 a radio-frequency chuck, said chuck comprising a stacked multi-layered structure of:
  a vacuum base plate for providing vacuum seal and mechanical support;
  a coolant module layer for extracting heat from the semiconductor device;
  a heating element layer adjoining said coolant module layer for heating said semiconductor wafer said heating element layer comprising a thin film power resistor; and
  a radio-frequency plate for associating an electromagnetic radio-frequency power source with the semiconductor wafer;
 a magnetron, said magnetron comprising:
  a base; and
  a magnetic array mounted to said base, said array comprising a plurality of unit cells, said unit cells comprising a plurality of magnets associated to produce a uniform magnetic field at the wafer.

* * * * *